United States Patent [19]

Van Der Meulen et al.

[11] Patent Number: 4,814,708
[45] Date of Patent: Mar. 21, 1989

[54] MAGNETIC RESONANCE IMAGING METHOD, AND DEVICE FOR DETERMINING THE PULSE ANGLE OF AN R.F. ELECTROMAGNETIC PULSE

[75] Inventors: Peter Van Der Meulen; Gerrit H. Van Yperen, both of Eindhoven, Netherlands

[73] Assignee: U.S. Philips Corporation, New York, N.Y.

[21] Appl. No.: 26,812

[22] Filed: Mar. 17, 1987

Related U.S. Application Data

[63] Continuation-in-part of Ser. No. 921,021, Oct. 20, 1986, abandoned.

[30] Foreign Application Priority Data

Mar. 20, 1986 [NL] Netherlands ................... 8600712

[51] Int. Cl.⁴ ............................................. G01R 33/20
[52] U.S. Cl. ..................................... 324/309; 324/307
[58] Field of Search ............... 324/300, 307, 309, 313, 324/314

[56] References Cited

U.S. PATENT DOCUMENTS 4,486,709 12/1984 Bendall ............................... 324/309
4,713,615 12/1987 Barratt et al. ....................... 324/307

Primary Examiner—Michael J. Tokar

[57] ABSTRACT

The known magnetic resonance imaging method of determining the r.f. power or pulse angle of an r.f. electromagnetic 90°-pulse or 180°-pulse has the drawback that the measurement inaccuracy is often high, that the experimentation time is comparatively long and that its use is limited to r.f. electromagnetic 90°-pulses or 180°-pulses only. In order to mitigate these drawbacks, it is proposed to determine the pulse angle of an r.f. electromagnetic pulse having a pulse angle $\alpha$ from two out of five echo resonance signals, including one stimulated echo resonance signal, generated by means of three r.f. electromagnetic $\alpha$°-pulses, $\alpha$ having an arbitrary value (calibration phase), after which any $\beta$ can be adjusted by adaptation of the applied r.f. power.

13 Claims, 1 Drawing Sheet

MAGNETIC RESONANCE IMAGING METHOD, AND DEVICE FOR DETERMINING THE PULSE ANGLE OF AN R.F. ELECTROMAGNETIC PULSE

This application is a continuation-in-part of U.S. application Ser. No. 921,021, filed Oct. 20, 1986, in the names of Peter Van Der Meulen and Gerrit Van Yperen, which prior application has been abandoned.

FIELD OF THE INVENTION

The invention relates to a magnetic resonance imaging method in which a region of a body is arranged in a uniform, steady magnetic field and a number of resonance signals are generated by means of a number of r.f. electromagnetic pulses.

The invention also relates to a magnetic resonance imaging device which includes:
(a) means for generating a steady, uniform magnetic field,
(b) means for generating an r.f. electromagnetic pulse,
(c) sampling means for sampling, during a measurement period, a resonance signal generated by the means specified sub (a) and (b),
(d) processing means for processing the signals supplied by the sampling means, and
(e) control means for controlling the means specified sub (b) to (d) for generating, sampling and processing echo resonance signals.

BACKGROUND OF THE INVENTION

It is known that such a method and device are suitable for determining the r.f. power of an r.f. electromagnetic pulse having a pulse angle of 90° or 180°. An r.f. electromagnetic pulse having a pulse angle $\alpha$ will be referred to hereinafter as $\alpha$-pulse. For the execution of the known method for determining the r.f. power of an r.f. electromagnetic 90°-pulse, a measurement cycle which includes an r.f. electromagnetic $\theta_o$-pulse, where $\theta_o$ is, for example smaller than 90°, and an r.f. electromagnetic 180°-pulse, said pulses being separated by an interval, is repeated a number of times, each time using a different pulse angle $\theta$ for the pulse angle $\theta_o$, where $\theta = \theta_o + n\Delta\theta$, wherein $\Delta\theta$ is a positive angular variation when $\theta_o < 90°$ and n=1 for the first repetition, n=2 for the second repetition etc. Because the intensity of an echo resonance signal is highest for a pulse angle of 90°, measurement of the intensities of the various echo resonance signals generated during the various measurement cycles enables estimation, by interpolation, of the r.f. power of an r.f. electromagnetic pulse which rotates the magnetization through 90°. For the determination of the r.f. power of an r.f. electromagnetic 180°-pulse, a similar method is performed; in that case a measurement cycle which includes an r.f. electromagnetic 90°-pulse and an r.f. electromagnetic $\theta_o$-pulse, where $\theta_o$ is, for example smaller than 180°, said pulse being separated by an interval, is repeated a number of times, where $\theta = \theta_o + n\Delta\theta$. Because the intensity of an echo resonance signal is also highest for a pulse angle of 180°, the measurement of the various intensities of a number of echo resonance signals similarly enables an estimation to be made by interpolation, of the r.f. power of an r.f. electromagnetic pulse which rotates the magnetization through 180°.

A fixed relationship exists between the pulse angle and the r.f. power of an r.f. electromagnetic pulse, i.e. the pulse angle is proportional to the square root of the r.f. power.

It is a drawback of the known method that the periods of time elapsing between the measurement cycles must be sufficiently long, that is to say much longer than the longitudinal relaxation time $T_1$, in order to ensure that after each measurement cycle a steady state is re-established which corresponds to the magnetization when spin nuclei are in a state of thermal equilibrium. Consequently, the total experimentation time is considerable, the more so because a comparatively large number of measurement cycles must be performed in order to make a reasonably acceptable estimation of the r.f. power, and hence the pulse angle, of an r.f. electromagnetic 90°-pulse or 180°-pulse. Due to the long experimentation time, the known method is more susceptible to the effects of motion. Moreover, using the known method, the r.f. power of an r.f. electromagnetic pulse other than a 90°-pulse or 180°-pulse can be determined only if the relationship between r.f. power and pulse angle is known. As has already been stated, the pulse angle is proportional to the root of the r.f. power. However, the determination of a proportionality constant is difficult in practice; usually only a coarse approximation of the proportionality constant will be known.

It is an object of the invention to provide a magnetic resonance imaging method and device in which the total experimentation time is comparatively short and the determination of the pulse angle of an r.f. electromagnetic pulse is accurate, for accurate adjustment of an arbitrary pulse angle on the basis thereof.

A pulse sequence where five resonance signals are generated by means of three r.f. electromagnetic pulses is known per se from Physical Review, Nov. 15, 1950, Volume 80, No. 4, pages 580–594, Hahn. However, this article does not disclose a method of determining the pulse angle of an r.f. electromagnetic $\alpha$°-pulse.

SUMMARY OF THE INVENTION

To achieve the foregoing objects, a magnetic resonance method of the kind set forth in accordance with the invention is characterized in that the number of r.f. electromagnetic pulses comprises at least three r.f. electromagnetic pulses whereby at least two echo resonance signals are generated, two of the echo resonance signals being combined in order to determine a pulse angle of one of the r.f. electromagnetic pulses. The pulse angle is thus accurately determined, after which the power required for an arbitrary pulse angle can be simply calculated from the pulse angle. When two r.f. electromagnetic $\alpha$°-pulses are generated separated by an interval, an echo resonance signal of the FID signal generated by the first r.f. electromagnetic $\alpha$°-pulse will occur. When after some time a third r.f. electromagnetic $\alpha$°-pulse is generated, four echo resonance signals will occur at intervals. One of these signals is a so-called stimulated echo, whilst another signal is an echo resonance signal of the echo resonance signal generated by the second r.f. electromagnetic $\alpha$°-pulse; the other two signals are echo resonance signals of an FID signal of the first and the second r.f. electromagnetic $\alpha$°-pulse, respectively. A version of a method in accordance with the invention is characterized in that the number of r.f. electromagnetic pulses amounts to three, one of the echo resonance signals being a stimulated echo resonance signal which is combined with another echo resonance signal. As will appear hereinafter, the determination of the r.f. power of an r.f. electromagnetic α°-pulse will thus be substantially less complicated.

A further version of a method in accordance with the invention is characterized in that two periods of time elapsing between the three r.f. electromagnetic pulses and a measurement period, during which at least two of the echo resonance signals are sampled, are chosen so that no interference occurs between the echo resonance signals. When these periods are sufficiently long and the measurement period during which sampling is performed is sufficiently short, the occurrence of interference phenomena which disturb the resonance signals can be prevented.

A further version of a method in accordance with the invention is characterized in that, in order to avoid interference between the resonance signals generated by the three r.f. electromagnetic pulses, the magnetic resonance imaging method is performed at least twice, each time using a different phase for an r.f. electromagnetic pulse. Interference signals superposed on echo resonance signals can thus be eliminated by the subtraction or addition of these echo resonance signals.

A further version of a magnetic resonance imaging method in accordance with the invention is characterized in that, in order to avoid interference occurring between resonance signals generated by the three r.f. electromagnetic pulses, a magnetic field gradient is generated during the execution of at least a part of the method.

A further version of a magnetic resonance imaging method in accordance with the invention is characterized in that each of the r.f. electromagnetic pulses has a pulse angle α which lies within the range $60° < α < 150°$. It has been found that the r.f. power of an r.f. electromagnetic pulse having a pulse angle α within said range can be determined with an accuracy greater that that of r.f. electromagnetic pulses having a pulse angle outside said range.

A further version of a magnetic resonance imaging method in accordance with the invention is characterized in that the three r.f. electromagnetic pulses have the same pulse angle α and the same pulse shape. As will appear hereinafter, the determination of the r.f. power is thus substantially simplified; this also implies a simplification of the computer means to be used and also a reduction of the computer time required.

A further version of a magnetic resonance imaging method in accordance with the invention is characterized in that the pulse angle α is calculated from the formula:

$$\alpha = 2 \arccos\left[\left(\frac{I_{MII}}{2I_{MI}}\right)^{\frac{1}{2}}\right]$$

When the r.f. power of an r.f. electromagnetic α°-pulse is determined at the centre of the measured echo resonance signal, $I_{MII}$ and $I_{MI}$ represent the intensity of the stimulated echo resonance signal and that of the other echo resonance signal, respectively. When the r.f. power is determined at the centre of the slice in the case in which the pulse angle α varies across the thickness of the excited slice, $I_{MII}$ and $I_{MI}$ represent the value of the time integral of the stimulated echo resonance signal and that of the other resonance signal, respectively.

A further version of a magnetic resonance imaging method in accordance with the invention is characterized in that for the correction of longitudinal relaxation effects, the magnetic resonance imaging method is executed at least twice, each time using a different time interval between the second and the third occurring r.f. electromagnetic pulse.

A further version of a magnetic resonance imaging method in accordance with the invention is characterized in that at least one of the three r.f. electromagnetic pulses is selective. For example, when the first r.f. electromagnetic pulse is generated in the presence of a magnetic field gradient $G_z$, an echo resonance signal will originate from a body slice extending perpendicularly to the z-direction. In the case that a second r.f. electromagnetic pulse is also generated in the presence of a magnetic field gradient $C_y$, the echo resonance signal will originate from a region which is defined both in the z-direction and in the y-direction. It can thus be ensured that an echo resonance signal originates from a predetermined volume part of the slice.

A further version of a magnetic resonance imaging method in accordance with the invention is characterized in that the first occurring pulse of said three r.f. electromagnetic pulses is preceded by at least one r.f. electromagnetic pulse. The latter pulse ensures that, in combination with the first r.f. electromagnetic pulse which succeeds the preceding pulse, an adequate amount of transverse magnetization exists exclusively in a volume defined in the x-direction and in the y-direction or in the x, y and z-directions; this ensures, possibly in combination with the fact that at least one of the three r.f. electromagnetic pulses succeeding the preceding pulse is selective, that an echo resonance signal originates from a predetermined volume part.

A further version of a magnetic resonance imaging method in accordance with the invention is characterized in that, prior to a determination of the r.f. power of an r.f. electromagnetic pulse having the pulse angle α, the pulse angle α is estimated by means of a coil quality factor. When the r.f. power of an r.f. electromagnetic pulse having a pulse angle α is to be determined, the pulse angle α and hence the r.f. power can be estimated in advance by means of the r.f. power dissipation which is related directly to the quality factor of a coil to be used. This estimation in advance offers a substantial reduction in the experimentation time.

A further version of a magnetic resonance imaging method in accordance with the invention is characterized in that, after determination of a pulse angle of the one r.f. electromagnetic pulse having a pulse angle α, a pulse angle β of an r.f. electromagnetic pulse to be subsequently generated is given by the formula:

$$\beta = \alpha (P_\beta/P_\alpha)^{\frac{1}{2}}$$

in which $P_{62}$ and $P_{60}$ and the r.f. powers of the r.f. electromagnetic pulse having the pulse angle β and the r.f. electromagnetic pulse having the angle α, respectively.

A magnetic resonance imaging device in accordance with the invention is characterized in that it includes means for combining two echo resonance signals in order to determine a pulse angle α of an r.f. electromagnetic pulse, it being possible to generate the echo resonance signals by means of at least three r.f. electromagnetic pulses.

BRIEF DESCRIPTION OF THE DRAWING

The invention will be described in detail hereinafter with reference to the drawing wherein.

DESCRIPTION OF THE PREFERRED EMBODIMENTS

Figure 1:
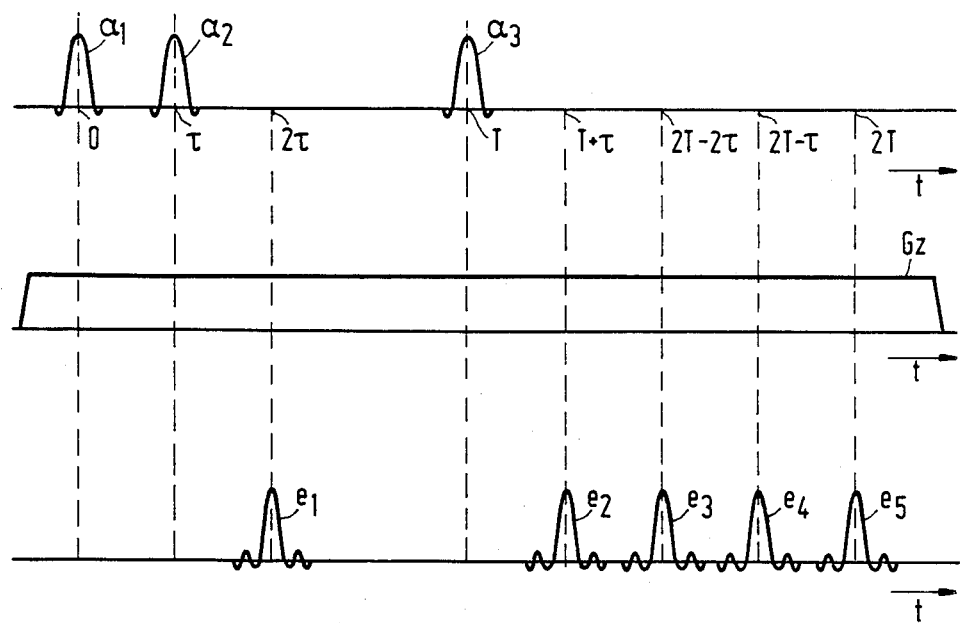
FIG. 1 illustrates a series of waveform diagrams which are useful in explaining the present invention.

In FIG. 1 two r.f. electromagnetic pulse having the pulse angles $\alpha_1$ and $\alpha_2$ are generated at the instants $t=0$ and $t=\tau$, respectively, in order to generate an echo resonance signal $e_1$ of an FID signal of the r.f. electromagnetic $\alpha_1$-pulse at the instant $t=2\tau$. Subsequently, at the instant $t=T$, an e.f. electromagnetic pulse having the pulse angle $\alpha_3$ is generated. Subsequently, at the instants $t=T+\tau$, $t=2T-2\tau$, $t=2T-\tau$ and $t=2T$, echo resonance signals $e_2$, $e_3$, $e_4$ and $e_5$, respectively, are generated. The echo resonance signal $e_2$ is a so-called stimulated echo, the echo resonance signal $e_3$ being an echo resonance signal of the echo resonance signal $e_1$, the echo resonance signals $e_4$ and $e_5$ being the echo resonance signal of the FID-signal of the r.f. electromagnetic $\alpha_1$-pulse and $\alpha_2$-pulse, respectively. During the entire pulse sequence a magnetic field gradient $G_z$ is sustained for the selective excitation of spins in the z-direction in a slice of a body. Because in practice a pulse angle $\alpha$ is not constant across the thickness of the excited slice, the pulse angle $\alpha$ and the r.f. power in the centre of the slice will be determined hereinafter. Moreover, in the following calculation the (stimulated) echo resonance signal $e_2$ is combined with the echo resonance signal $e_1$. This is done because the intensities of the two echo resonance signals have the same dependency on the $T_2$ relaxation time so that, as will be demonstrated, no $T_2$ relaxation corrections will be required for the calculated r.f. power.

Figure 2:
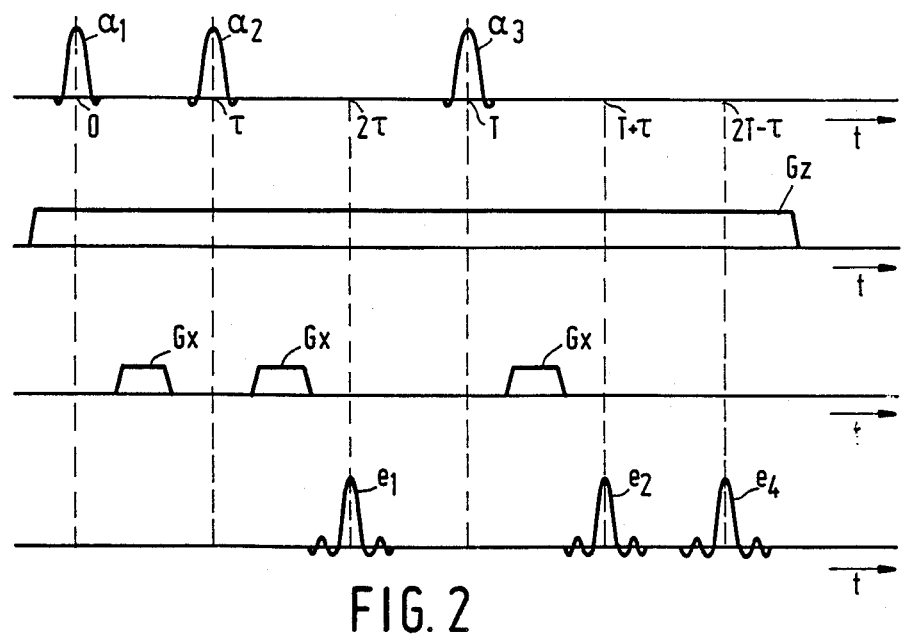
FIG. 2 illustrates a series of waveform diagrams which are used in a preferred method according to the invention.

Because the echo resonance signals $e_1$ and $e_2$ are combined, it is attractive (as shown in FIG. 2) to generate three times a magnetic field gradient $G_x$ in order to dephase undesired signals in the x-direction, so that interference of the resonance signals (FID as well as echo resonance signals) is prevented. This magnetic field gradient $G_x$ suppresses the echo resonance signals $e_3$, $e_5$ and the FID resonance signals in FIG. 2 which are caused by the r.f. electromagnetic pulses $\alpha_2$ and $\alpha_3$.

In order to minimize $T_1$ relaxation time effects on the resonance signals, it is advisable to select $T \ll T_1$. In order to eliminate any effects of body motions, T and $\tau$ should be chosen so as to be as small as possible, For the sake of simplicity it will be assumed that the three r.f. electromagnetic $\alpha°$-pulses have the same pulse angle $\alpha$ and the same pulse shape.

The following holds good for the echo resonance signals $e_1$ and $e_2$ $$M(t') = M_{max} \int_{-\infty}^{\infty} f(z)p(x,y,z)e^{i\gamma G_z z t'} dxdydz \quad (1)$$

in which:

$t'=t-2T$ and $t'=t-(T+\tau)$ for the echo resonance signals $e_1$ and $e_2$, respectively, $M(t')$ is the amplitude of the echo resonance signal at the instant $t'$, $M_{max}$ is the maximum amplitude of the echo resonance signal, $f(z)$ is the selection function of an r.f. electromagnetic pulse, $p(x,y,z)$ is the standardized spin density distribution in the excited slice of a body, $G_z$ is the magnetic selection field gradient, $\gamma$ is the gyromagnetic ratio.

When the spin density distribution $p(x,y,z)$ is assumed to be homogeneous across the thickness of the exited slice, the following holds good:

$$M(t') = M_{max} \int_{-\infty}^{\infty} f(z)e^{i\gamma G_z z t'} dz \quad (2)$$

When the echo resonance signal is measured between the instants $t'=-\frac{1}{2}t_\beta$ and $t'=\frac{1}{2}t_\beta$, the modulus of the time integral of the amplitude of the echo resonance signal will be a measure of the intensity $I_M$ of the echo resonance signal at the centre of the excited slice:

$$I_M = \left| \int_{-\frac{1}{2}t_\beta}^{\frac{1}{2}t_\beta} M(t)dt \right| = \quad (3)$$

$$\left| M_{max} \int_{-\frac{1}{2}t_\beta}^{\frac{1}{2}t_\beta} \int_{-\infty}^{\infty} f(z)e^{i\gamma G_z z t} dzdt \right| =$$

$$\left| M_{max} \int_{-\infty}^{\infty} f(z) \frac{t_\beta \sin(\gamma G_z z \cdot \frac{1}{2}t_\beta)}{\gamma G_z z \cdot \frac{1}{2}t_\beta} dz \right|$$

in which t is inserted for $t'$. When the width of the function $f(z)$ is much greater than the width of the sinc function $$\frac{\sin(\gamma G_z z \frac{1}{2} t_\beta)}{\gamma G_z z \frac{1}{2} t_\beta}$$

the integral will produce a suitable approximation of a value proportional to the intensity $I_M$ at the centre of the excited slice. Therefore, if $z\frac{1}{2}$ is the half-width value of the function $f(z)$, $(f(z\frac{1}{2})=f(-z\frac{1}{2})=\frac{1}{2}f(0))$, so $$t_\beta \gg 2\pi/\gamma G_z z\frac{1}{2} \quad (4)$$

In that case, the following equation is a suitable approximation:

$$I_M = M_{max} t_\beta \pi f(0) \quad (5)$$

Ignoring the effects of motion, $T_1$ relaxation and diffusion during the pulse sequence, and assuming (4) for the intensities $I_{Me_1}$ and $I_{Me_2}$ at the centre of the excited slice, the following will hold good for the echo resonance signals $e_1$ and $e_2$, respectively:

$$I_{Me_1} = t_\beta \pi f(0)\sin(\alpha) \cdot [\sin(\alpha/2)]^2 M_0 e^{-2\tau/T_2} \quad (6)$$

$$I_{Me_2} = t_\beta \pi f(0)\frac{1}{2}[\sin(\alpha)]^3 M_0 e^{-2\tau/T_2} \quad (7)$$

in which:

$M_0$ is the magnetization in thermal equilibrium at the centre of the excited slice, $T_2$ is the transverse relaxation time which is assumed to be constant across the excited slice.

It follows from equations (6) and (7) that:

$$\alpha = 2 \arccos\left[\left(\frac{I_{MII}}{2I_{MI}}\right)^{\frac{1}{2}}\right] \quad (8)$$

Equation (8) provides an estimate of the pulse angle $\alpha$ at the centre of the excited slice. Error calculation reveals that this estimation is appropriate in the range $60° < \alpha < 150°$.

When the pulse angle $\alpha$ is known, any other pulse angle $\beta$ can be simply adjusted to by modifying the applied r.f. power $P_\alpha$:

$$P_\beta = P_\alpha \cdot (\beta/\alpha)^2 \quad (9)$$

Therein, $P_{60}$ and $P_\beta$ are the r.f. power for generating the r.f. electromagnetic $\alpha°$-pulse and $\beta°$-pulse, respectively. A proportionality constant occurring in a relation between a pulse angle and an r.f. power no longer occurs in equation (9) because of the ratio of the pulse angles and powers.

When $T_1$ relaxation effects cannot be ignored during the period $(T-\tau)$ of the experiment, the right-hand term of the equation (7) should be multiplied by a term $e^{-(T-\tau)/T_1}$. For the execution of two measurements, each time using a different value for the duration T and calculating the quotient $$R = \frac{I_{MII}}{I_{MI}} = 2\left\{\cos\frac{\alpha}{2}\right\}^2 \cdot e^{-(T-\tau)/T_1}$$

during a first measurement and the quotient $$R' = \frac{I'_{MII}}{I'_{MI}} = \left\{\cos\frac{\alpha}{2}\right\}^2 \cdot e^{-(T'-\tau)/T_1}$$

during a second measurement, so that $(T'-\tau) = n(T-\tau)$, where n is, for example an integer, the pendant of the equation (8) which has been corrected for the $T_1$ relaxation time effects can be written as:

$$\alpha = 2 \arccos\left[\{\frac{1}{2} \cdot (R/R')^{\frac{1}{n-1}} \cdot R\}^{\frac{1}{2}}\right] \quad (10)$$

This method can be used when the relaxation time $T_1$ is unknown. When this relaxation time is known, the version of the equation (8) which has been corrected for the relaxation time $T_1$ will be:

$$\alpha = 2 \arccos\left[\left(\frac{I_{MII}}{2I_{MI}} \cdot e^{(T-\tau)/T_1}\right)^{\frac{1}{2}}\right] \quad (11)$$

As appears from the cited article by Hahn in Physical Review, when the pulse angles $\alpha_1$, $\alpha_2$ and $\alpha_3$ are unequal, the equations (6) and (7) will be:

$$I_{M_{e1}} = t_\beta \pi f(o) \sin\alpha_1 (\sin\alpha_2/2)^2 M_o e^{-2\tau/T_2} \quad (12)$$

$$I_{M_{e2}} = t_\beta \pi f(o) \cdot \tfrac{1}{2} \sin\alpha_1 \sin\alpha_2 \sin\alpha_3 M_o e^{-2\tau/T_2} \quad (13)$$

When the pulse angles $\alpha_1$, $\alpha_2$ and $\alpha_3$ are unequal in the above case, and the pulse angle $\alpha_2$ must be calculated, during a first measurement the quotient $$R = \frac{I_{M_{e2}}}{I_{M_{e1}}} = \frac{\sin\alpha_2 \sin\alpha_3}{\{\sin\alpha_2/2\}^2}$$

will be calculated and during a second measurement the quotient $$R' = \frac{I'_{M_{e2}}}{I'_{M_{e1}}} = \frac{\sin\alpha'_2 \sin\alpha_3}{\{\sin\alpha'_2/2\}^2}$$

thus, during this measurement there is generated an r.f. electromagnetic pulse having a pulse angle $\alpha'_2$ instead of a pulse angle $\alpha_2$. When the pulse angle $\alpha'_2$ is, for example a multiple of the pulse angle $\alpha_2$, the pulse angle $\alpha_2$ and hence the corresponding r.f. power can be calculated from the quotients R and R'.

What is claimed is:

1. A magnetic resonance imaging method in which a region of a body is arranged in a uniform, steady magnetic field and a number of resonance signals are originated in response to a number of r.f. electromagnetic pulses having respective pulse angles, wherein the number of r.f. electromagnetic pulses comprises at least three r.f. electromagnetic pulses and at least two echo resonance signals are originated, two of the echo resonance signals being compared in order to determine the pulse angle of one of the r.f. electromagnetic pulses.

2. A magnetic resonance imaging method as claimed in claim 1, wherein one of the echo resonance signals being a stimulated echo resonance signal which is compared with another echo resonance signal.

3. A magnetic resonance imaging method as claimed in claim 2, wherein said three pulses occur in time-spaced sequence and two periods of time elapsing between the three r.f. electromagnetic pulses and a measurement period during which at least two of the echo resonance signals are detected have durations such that no interference occurs between the echo resonance signals.

4. A magnetic resonance imaging method as claimed in claim 1, 2 or 3, wherein in order to avoid interference between the resonance signals originated by the three r.f. electromagnetic pulses, the magnetic resonance imaging method is performed at least twice, each time using a different phase for an r.f. electromagnetic pulse.

5. A magnetic resonance imaging method as claimed in claim 1, 2 or 3 wherein in order to avoid interference occurring between resonance signals originated by the three r.f. electromagnetic pulses, a magnetic field gradient is generated during the execution of at least a part of the method.

6. A magnetic resonance imaging method as claimed in any one of claims 1, 2 or 3 wherein each of the r.f. electromagnetic pulses has a pulse angle $\alpha$ which lies within the range $60° < \alpha < 150°$.

7. A magnetic resonance imaging method as claimed in any one of the claims 1, 2, or 3 wherein the three r.f.

electromagnetic pulses have the same pulse angle α and the same pulse shape.

8. A magnetic resonance imaging method as claimed in any one of the claims 1, 2, or 3 wherein the three r.f. electromagnetic pulses have the same pulse angle α and the pulse angle α is calculated from the formula:

$$\alpha = 2 \arccos\left[\left(\frac{I_{MII}}{2I_{MI}}\right)^{\frac{1}{2}}\right]$$

in which $I_{MII}$ and $I_{MI}$ represent the intensity of the stimulated echo resonance signal and that of the other echo resonance signal, respectively.

9. A magnetic resonance method as claimed in any of the claims 1, 2, or 3, wherein for the correction of longitudinal relaxation effects, the magnetic resonance imaging method is executed at least twice, each time using a different time interval between the second and the third occurring r.f. electromagnetic pulse.

10. A magnetic resonance imaging method as claimed in any of the claims 1, 2 or 3 wherein the three r.f. electromagnetic pulses have the same pulse angle α and the pulse angle α is calculated from the formula:

$$\alpha = 2 \arccos\left[\{\frac{1}{2}(R/R^1)^{\frac{1}{n-1}} \cdot R\}^{\frac{1}{2}}\right]$$

in which $$R = \frac{I_{MII}}{I_{MI}} \text{ and } R' = \frac{I'_{MII}}{I'_{MI}}$$

in which $T_1$ is the longitudinal relaxation time, $\tau$ is the period of time elapsing between the first and the second occurring r.f. electromagnetic pulse, and T and T' are the periods of time elapsing between the second and the third occurring r.f. electromagnetic pulse during a first and a second measurement, respectively, and $$n = \frac{T' - \tau}{T - \tau},$$

and in which $I_{MII}$ and $I_{MI}$ represent the intensity of the stimulated echo resonance signal and that of the other echo resonance signal respectively and the prime (') notations relate to the second measurement.

11. A magnetic resonance imaging method as claimed in any one of the claims 1-3, characterized in that at least one of the three r.f. electromagnetic pulses is selective.

12. A magnetic resonance imaging method as claimed in any one of the claims 1-3 characterized in that the first occurring pulse od said three r.f. electromagnetic pulses is preceded by at least one r.f. electromagnetic pulse.

13. A magnetic resonance imaging method as claimed in any one of the claims 1-3 wherein, after determination of the pulse angle of the one r.f. electromagnetic pulse having a pulse angle α, a pulse angle β of an r.f. electromagnetic pulse to be subsequently generated is given by the formula:

$$\beta = \alpha \{P_\beta/P_\alpha\}^{\frac{1}{2}}$$

in which $P_\beta$ and $P_{60}$ are the r.f. powers of the r.f. electromagnetic pulse having the pulse angle β and the r.f. electromagnetic pulse having the angle α, respectively.

* * * * *